United States Patent [19]
Hebert et al.

[11] Patent Number: 5,681,776
[45] Date of Patent: Oct. 28, 1997

[54] PLANAR SELECTIVE FIELD OXIDE ISOLATION PROCESS USING SEG/ELO

[75] Inventors: Francois Hebert, Sunnyvale; Datong Chen, Fremont; Rashid Bashir, Santa Clara, all of Calif.

[73] Assignee: National Semiconductor Corporation, Santa Clara, Calif.

[21] Appl. No.: 708,359

[22] Filed: Sep. 4, 1996

Related U.S. Application Data

[63] Continuation of Ser. No. 213,199, Mar. 15, 1994, abandoned.

[51] Int. Cl.$^6$ .................................................. H01L 21/76
[52] U.S. Cl. .................................................. 437/72; 437/90
[58] Field of Search .................................. 437/67, 72, 89, 437/90; 148/DIG. 85, DIG. 86

[56] References Cited

U.S. PATENT DOCUMENTS

| | | | |
|---|---|---|---|
| 3,891,469 | 6/1975 | Moriyama et al. | 148/1.5 |
| 4,541,168 | 9/1985 | Galie et al. | 29/579 |
| 4,549,927 | 10/1985 | Goth et al. | 156/643 |
| 4,663,832 | 5/1987 | Jambotkar | 29/576 |
| 4,671,851 | 6/1987 | Beyer et al. | 156/645 |
| 4,786,960 | 11/1988 | Jeuch | 357/42 |
| 4,900,692 | 2/1990 | Robinson . | |
| 4,926,231 | 5/1990 | Hwang et al. | 357/30 |
| 4,948,456 | 8/1990 | Schubert . | |
| 5,073,516 | 12/1991 | Moslehi | 437/90 |
| 5,087,586 | 2/1992 | Chan et al. | 437/90 |
| 5,108,946 | 4/1992 | Zdebel et al. . | |
| 5,112,439 | 5/1992 | Reisman et al. . | |
| 5,130,268 | 7/1992 | Liou et al. | 437/67 |
| 5,175,122 | 12/1992 | Wang et al. | 437/67 |
| 5,236,863 | 8/1993 | Iranmesh | 437/72 |
| 5,278,092 | 1/1994 | Sato | 437/72 |
| 5,457,338 | 10/1995 | Borel | 257/510 |

FOREIGN PATENT DOCUMENTS

| | | |
|---|---|---|
| 61-281537 | 12/1986 | Japan . |
| 63-141346 | 6/1988 | Japan . |
| 63-258040 | 10/1988 | Japan . |
| 4-151852 | 5/1992 | Japan . |

OTHER PUBLICATIONS

A. Feygenson, "Complementary Bipolar By Selective Epitaxial Growth," 4th Innovations in Si Deposition Technology for Advance Device Structures Seminar, Applied Materials, Feb. 1990.

S. Wolf, Silicon Processing for the VLSI Era–Volume II, Chapter 2 1990.

J. Borland, et al., Solid–State Technology, p. 111, Jan. 1988.

J. Manoliu and J. Borland, IEDM Technical Digest, p. 20, 1987.

S. Nagao, et al., IEEE Trans. Elec. Dev., p. 1738, Nov. 1986.

Y.C. Yu, et al., Journal of the Electrochemical Society, p. 2562, Oct. 1988, and S. Sunderam, et al., IEEE BCTM, p. 26, 1990.

Endo et al., "Scaled CMOS Technology Using SEG Isolation and Buried Well Process", IEEE Trans. on Elect. Dev., vol. ED-33, No. 11, pp. 1659–1666 (1986).

Sunderam et al., "Novel Isolation Process Using Selective Polysilicon Filled Trench Technology for High Speed Bipolar Circuits", IEEE Bipolar Circuits and Technology Meeting 1.2, pp. 26–28 (1990).

*Primary Examiner*—George Fourson
*Attorney, Agent, or Firm*—Limbach & Limbach L.L.P.

[57] ABSTRACT

An isolation method for separating active regions on a semiconductor substrate is disclosed. Portions of the substrate not corresponding to the active regions are etched to a predetermined depth. After some oxide, nitride and dielectric deposition steps, a photoresist is patterned on the dielectric material such that the photoresist completely covers the active regions of the substrate and overlaps into the portions of the substrate that are eventually to represent field oxide regions. Any portion of the dielectric, nitride oxide layers that are not covered by the photoresist are removed and a combined step of selective epitaxial growth (SEG) and epitaxial lateral overgrowth (ELO) is performed. The exposed silicon is then oxidizing and the dielectric, nitride and oxide layers are removed from the active regions of the substrate. The semiconductor device is then ready for subsequent processing.

9 Claims, 4 Drawing Sheets

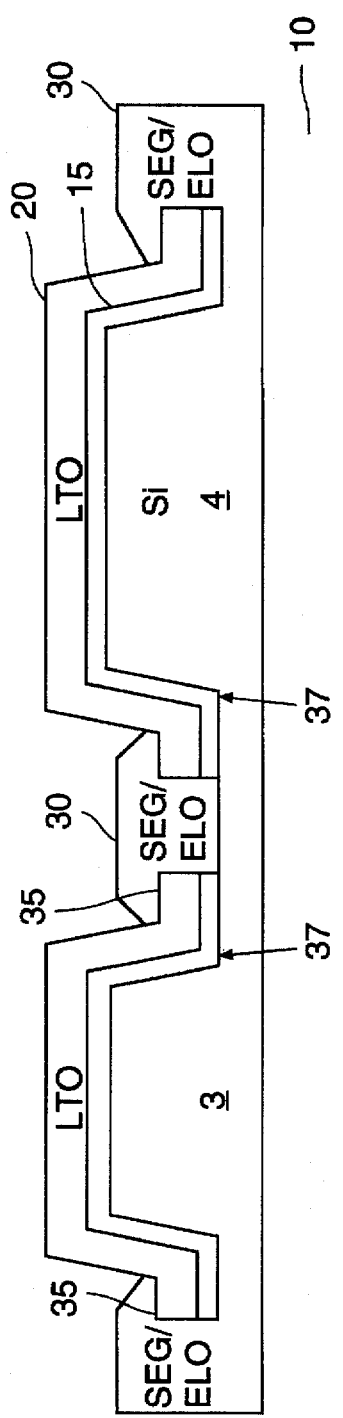
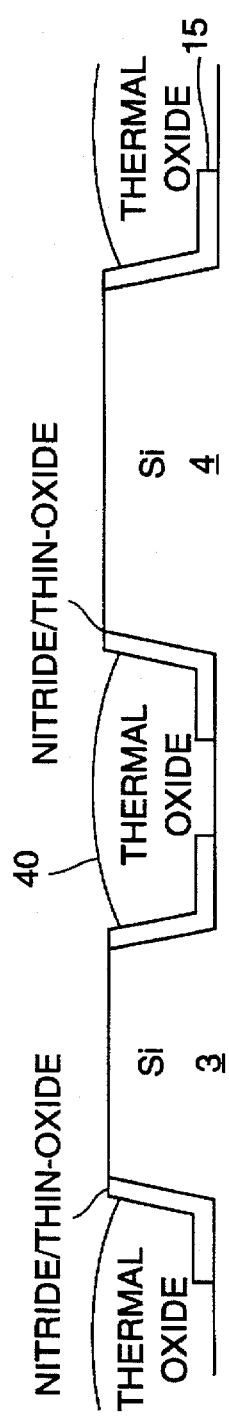
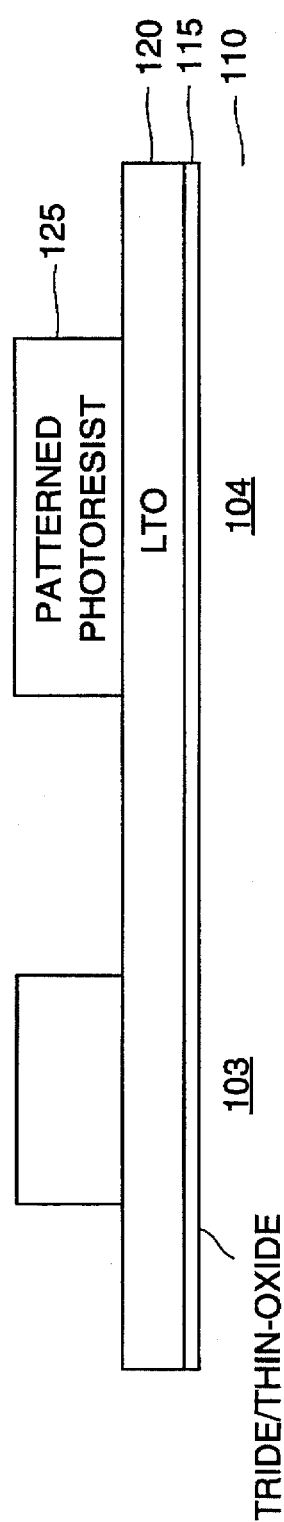
FIG. 4
FIG. 5
FIG. 6

PLANAR SELECTIVE FIELD OXIDE ISOLATION PROCESS USING SEG/ELO

This is a continuation of prior complete application Ser. No. 08/213,199 filed on Mar. 15, 1994 by Francois Hebert et al., abandoned, for PLANAR SELECTIVE FIELD OXIDE ISOLATION PROCESS AND STRUCTURES USING SEG/ELO.

FIELD OF THE INVENTION

The present invention is directed to a fully planarized, field oxide isolation structure formed in both a self-aligned fashion and a non-self-aligned fashion. The present invention finds ready applicability to a wide variety of high performance technologies which require low capacitances and planar wafer surfaces.

BACKGROUND OF THE INVENTION

Planar field oxide structures have been produced in the prior art using selective epitaxial growth (SEG). SEG has been used in two ways: (1) SEG for the active areas; and (2) SEG for the oxide areas.

The first method, SEG for active areas, has been disclosed in various publications such as: A. Feygenson, "Complementary Bipolar By Selective Epitaxial Growth," 4th Innovations in Si Deposition Technology for Advance Device Structures Seminar, Applied Materials, February 1990; S. Wolf, Silicon Processing for the VLSI Era-Volume II, Chapter 2; J. Borland, et al., Solid-State Technology, p. 111, January 1988; J. Manoliu and J. Borland, IEDM Technical Digest, p. 20, 1987; and S. Nagao, et al., IEEE Trans. Elec. Dev., p. 1738, November 1986.

The methods taught by these various references have several problems which are non-exhaustively listed herein. First, the quality of the material selected is critical because devices will be fabricated within the SEG if the SEG is used to form the active areas. Second, faceting can occur at the corners between the SEG and the field oxide areas, resulting in dips. The presence of such dips interferes with the planar surface desired and results in the need for additional steps to further planarize the surface. Third, edge and perimeter defects do not allow for fully-walled junctions. Fourth, an extra over-growth and etch-back step is required in order to achieve a planar surface.

The second method of forming planar field oxide structures, as mentioned above, is by using SEG in field oxide areas. According to this method, silicon mesas are formed on the surface of a silicon substrate. SEG is grown in the shallow trench areas which will ultimately correspond to the field oxide areas. The SEG is then oxidized to form the field oxide areas. Examples of prior art teaching this concept include Y. C. Lu, et al., Journal of the Electrochemical Society, p. 2562, October 1988, and S. Sunderam, et al., IEEE BCTM, p. 26, 1990.

Although this second method has advantages over the first method because SEG is used for the active areas, it still has some disadvantages. The main advantage of this method over the first method is that the quality of the SEG is not critical (for example, selective polysilicon may be used). Another advantage is that walled junctions may be realized.

One of the various disadvantages encountered by the second method is that critical control and selection of the sidewall nitride films is required. Also, stress is often times generated at the edges and base of the active areas. Finally, most prior an methods cannot use oxide as the masking material for the active areas, which reduces SEG selectivity.

BRIEF DESCRIPTION OF THE DRAWINGS

FIGS. 1 through 5 illustrate the structures resulting from practicing the non-self-aligned method according to the present invention. These figures particularly show the following:

FIG. 1 illustrates a silicon substrate after mesa patterning and etching have been completed as well as nitride and LTO deposition.

FIG. 2 illustrates the structure of FIG. 1 with patterned photoresist layers.

FIG. 3 illustrates the structure of FIG. 2 after the oxide and nitride layers have been etched and the photoresist has been stripped.

FIG. 4 illustrates the structure of FIG. 3 after SEG and ELO growth.

FIG. 5 illustrates the structure of FIG. 4 after oxidation of the exposed silicon, followed by etching of the LTO and the nitride from the active areas.

FIGS. 6 through 12 illustrate the structures resulting at various stages from practicing the self-aligned method according to the present invention. Particularly, the figures show the following:

FIG. 6 illustrates the surface of a silicon substrate with a nitride/thin oxide layer, and LTO, and a patterned photoresist.

FIG. 7 illustrates the structure of FIG. 6 after a step of etching into the silicon and growing a layer of thin oxide and depositing nitride.

FIG. 8 illustrates the structure of FIG. 7 after another LTO layer is deposited and etched back to form spacers.

FIG. 9 illustrates the structure of FIG. 8 after the exposed nitride and thin oxide have been etched from the silicon surface.

FIG. 10 illustrates the structure of FIG. 9 after a step of SEG and ELO growth.

FIG. 11 illustrates the structure of FIG. 10 after the exposed silicon has been oxidized.

FIG. 12 illustrates the structure of FIG. 11 after the LTO has been etched away from the active areas and the exposed nitride has been etched.

SUMMARY OF THE INVENTION

The present invention overcomes the problems associated with the prior art by combining the advantages of using selective epitaxial growth (SEG) in the field oxide areas with the use of epitaxial lateral overgrowth (ELO) such that the SEG seed region is removed from the edges and base of the active areas of a silicon substrate. This reduces stress and, hence, reduces material defects originating from the bottom corners of the active silicon and oxide regions. Oxide spacers are used to improve planarity and selectivity during the SEG/ELO process.

Some of the advantages realized by practicing the present invention as disclosed in the detailed description of the invention are briefly mentioned below.

(1) The structure resulting from practicing the present invention has fully walled active areas with planar field oxide regions.

(2) The structure can be scaled to any field oxide thickness.

(3) SEG/ELO quality is non-critical (for example, selective polysilicon may be used).

(4) The structure is not sensitive to spacer side wall thickness because there is no encroachment of the active areas.

(5) The exposed LTO improves the growth selectivity of the SEG/ELO, when compared to nitride deposited using low pressure chemical vapor deposition (LPCVD).

(6) The structures according to the present invention may be realized according to a fully self-aligned method or by a simple one-mask method.

(7) Stress is reduced by using oxide spacers on the active area side walls and by using ELO above the silicon substrate.

Other features and advantages will become apparent in view of the following detailed description.

DETAILED DESCRIPTION OF THE PREFERRED EMBODIMENTS

Two embodiments of the present invention have been disclosed in the figures, a non-self-aligned method and a self-aligned method. The non-self-aligned method is the subject of FIGS. 1 through 5 and will be discussed first.

Figure 1:
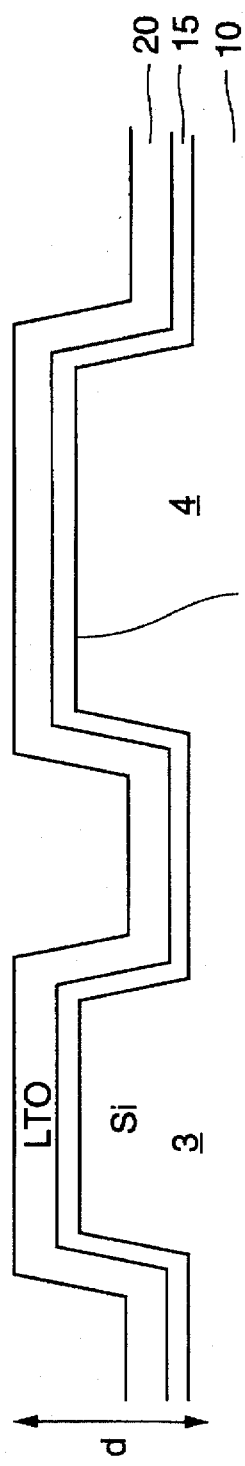

The non-self-aligned method is the simpler of the two methods. Referring to FIG. 1, a silicon wafer or substrate 10 is first patterned with a mask to define the active regions 3 and 4 on the substrate 10. The silicon is then etched away from the field oxide regions (or non-active regions), to a particular depth d, thereby forming "mesas". The depth d to which the silicon is etched is equal to the oxide thickness that is ultimately desired. Once this is done, the mask is stripped and a thin oxide layer, or pad oxide, is formed. This oxide layer is preferably between 200 Å and 400 Å thick. Then, a nitride deposition step is performed. The nitride is preferably deposited to a thickness of 500 Å to 1000 Å using low pressure chemical vapor deposition (LPCVD). This nitride layer will act as an oxidation mask. The pad oxide and nitride layer are represented in the figures as one layer 15. Optionally, the wafer may be coated with a low temperature deposited oxide layer (LTO) 20. The LTO 20, when used, is deposited to a thickness of 0.1 to 0.2 micrometers.

Figure 2:
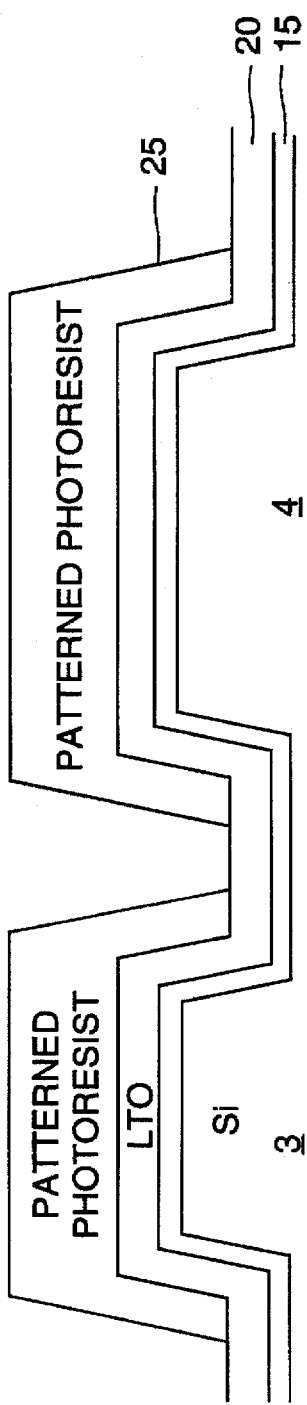

The wafer is then coated with a photoresist 25 and the photoresist 25 is patterned using a mask similar to the active region mask previously used, except that the mask used in this step is larger so as to overlap the silicon "mesas." The thickness of this overlapping photoresist 25 is approximately 0.5 to 1.0 micrometers, which can easily be achieved using a number of readily available modern exposure tools typically used in these environments. The resulting structure is shown in FIG. 2.

Figure 3:
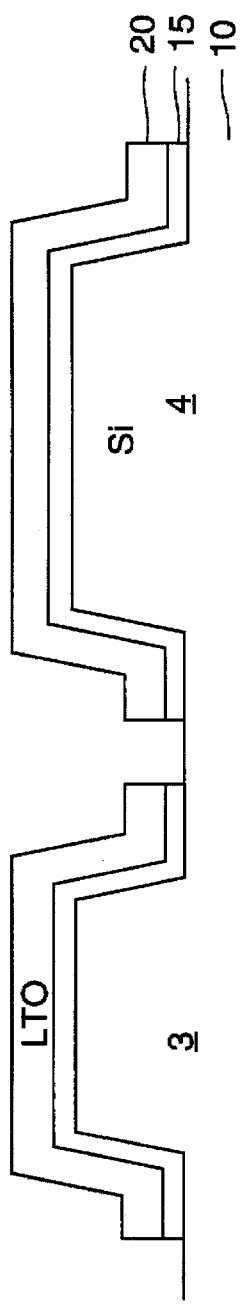
Figure 7:
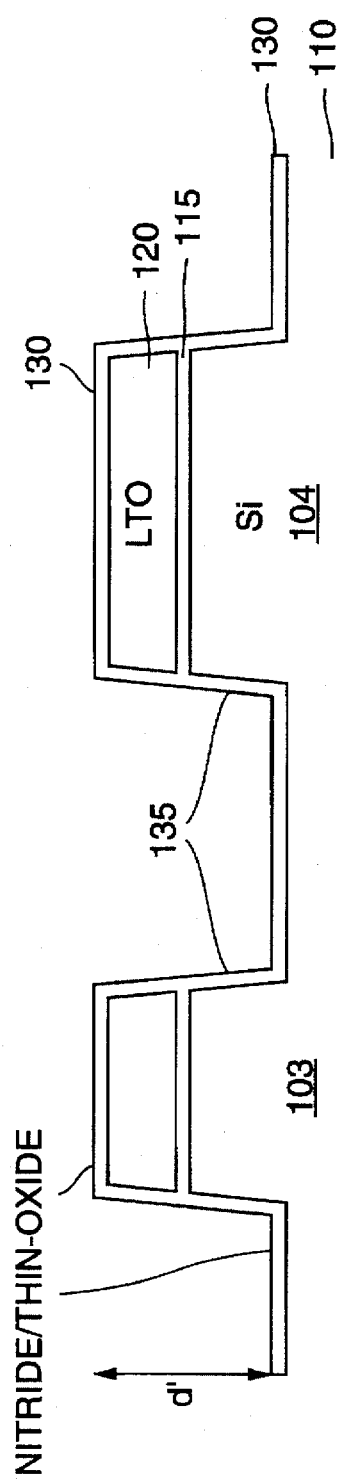

Then, as shown in FIG. 3, the exposed LTO 20 and pad oxide and nitride layer 15 are etched using a plasma enhanced or reactive ion etching (RIE) type of etching process. The etching is stopped at the surface of the silicon substrate 10. The various etchants that may be used include $CHF_3+O_2$, $CHF_3+CF_4$, $CHF_3+C_2F_6$, or $CF_4+H_2$. FIG. 3 shows the wafer after the resist layer has been stripped away. It is important to note that by using the overlapping photoresist mask 25, oxide steps 35 have been formed. The advantage provided by these steps will be apparent from the discussion of the SEG/ELO growth.

At this point, the wafer is cleaned in preparation for a selective epitaxial growth (SEG) deposition process combined with an epitaxial lateral overgrowth (ELO) process. According to this combined process, silicon is deposited on the exposed silicon surfaces while etching of the silicon thus deposited occurs on the dielectric covered surfaces. The selectivity of the process is enhanced when the dielectric used is oxide. This is why it is preferable to have an LTO layer 20 deposited on top of the nitride/oxide layer 15. The SEG/ELO layer 30 is formed to a thickness of approximately 50% of the ultimately desired field oxide thickness. For example, if a 1 micrometer oxide thickness is needed on the field regions, the SEG/ELO layer 30 is formed to a thickness of approximately 0.4 to 0.6 micrometers. The resulting structure is shown in FIG. 4.

The SEG/ELO layer 30 can be grown in an epitaxial reactor with low pressure capabilities. Typical SEG/ELO growth conditions include a temperature of 900–1050 degrees Celsius and pressures of less than 40 Torr. Dichlorosilane can be used as the silicon source gas. Hydrochloric (HCl) gas can be used to achieve selectivity. Finally, $H_2$ can be used as the carrier gas. SEG/ELO layer 30 can be grown in conventional batch reactors such as the AMT7800 (manufactured by Applied Materials) and those reactors manufactured by Gemini (Versions 1 and 2), provided that low pressure retrofits are added. Alternatively, layer 30 can be grown in advanced single wafer epitaxial reactors.

The silicon grown by SEG, as shown in FIG. 4, overlaps the oxide steps 35 which were previously formed. As such, the growth of the silicon by the SEG/ELO process is spaced from the corners 37 of the active regions 3 and 4. Therefore, any stresses or defects that would otherwise be present at corners 37, are removed by using the spacing according to the present invention. Furthermore the silicon growth overlapping oxide steps 35 permits fully walled active region.

As shown in FIG. 5, the wafers are oxidized so that the SEG/ELO layer 30 is convened to $SiO_2$ 40. The LTO 20 and the pad oxide and nitride layer 15 are then removed from the active regions by etching.

A second embodiment of the present invention, namely the self-aligned method, will now be discussed in connection with FIGS. 6 through 12.

The preparation of a wafer is shown in FIG. 6. A thin oxide layer is grown on a substrate 110 and a thin nitride layer is deposited on top of the thin oxide layer (both layers are represented by numeral 115). Then, an LTO film 120, having a thickness of approximately 0.1 to 0.2 micrometers, is deposited. A patterned photoresist mask 125 is used to define the active regions 103 and 104 of the substrate 110.

The LTO 120 and nitride/oxide layer 115 are etched from substrate 110 thereby exposing certain portions of substrate 110 that correspond to field oxide regions. The silicon substrate 110 is also etched to a predetermined depth "d'", thereby producing "mesas". The photoresist mask 125 is stripped from the substrate 40. Then, another thin oxide and thin nitride film 130 is deposited over the wafer to cover the sidewalls 135 and field regions of the mesas formed during the etching step. The thin oxide and thin nitride film 130 also covers the top of the mesas resulting in the structures shown in FIG. 7. In a manner similar to the previous embodiment, the depth d' to which the silicon is etched is equal to the ultimately desired field oxide thickness.

Figure 8:
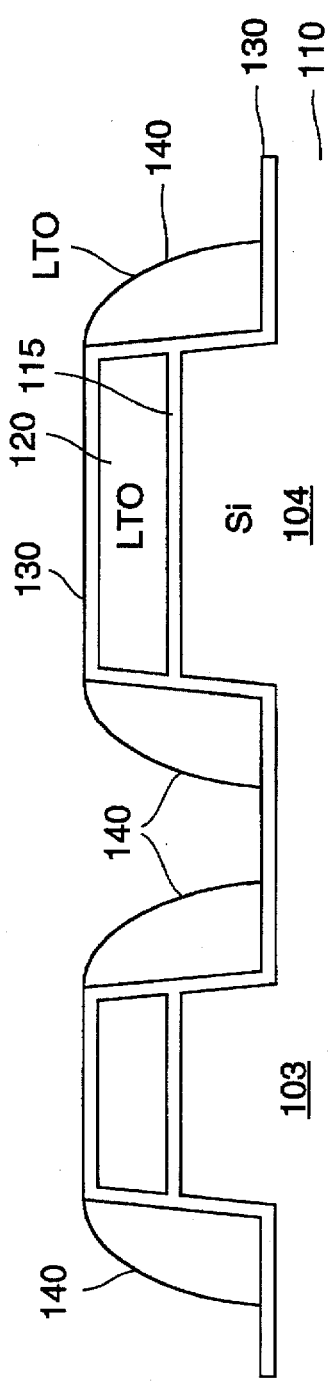

As shown in FIG. 8, a thick LTO layer is deposited over the entire wafer and etched back to form spacers 140. The LTO is preferably conformal.

Figure 9:
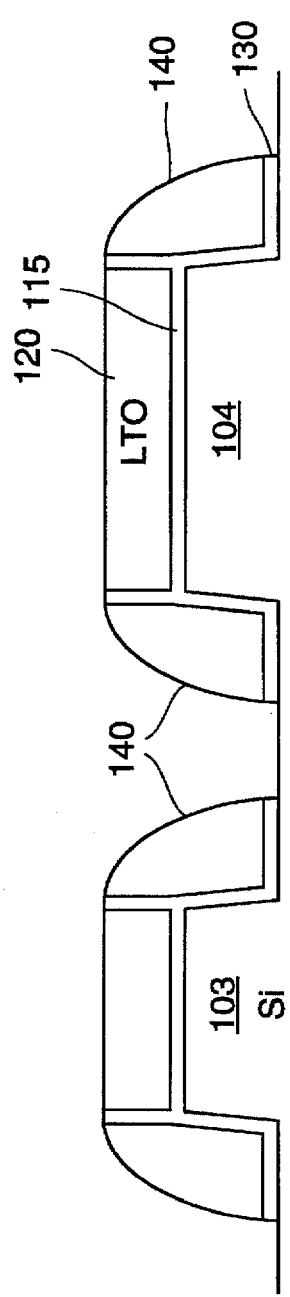

The exposed thin nitride and thin oxide layer 130 is then etched by using selective etching for the nitride and blanket etching for the oxide, both with end point detection on the silicon substrate. The resulting structure is shown in FIG. 9.

Figure 10:
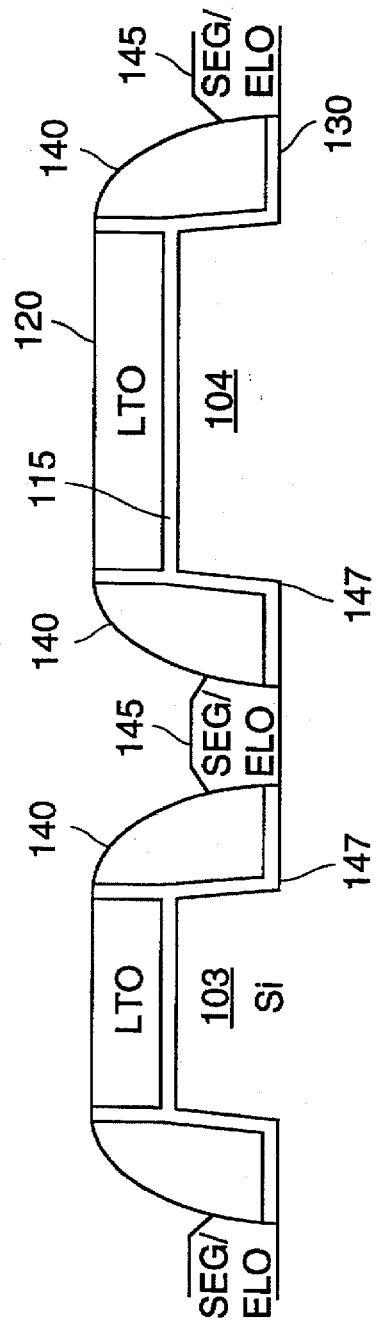

An SEG/ELO layer 145 is then grown on the wafers to a thickness approximately equal to one-half of the ultimately desired field oxide thickness, which is equal to one-half of the step height of the various layers deposited on the wafers. The details of the SEG/ELO process are the same as previously discussed in connection with the first embodiment. The result is shown in FIG. 10.

With advantages similar to those of the first embodiment, corners 147 of the active regions 103 and 104 are spaced from the location of the SEG/ELO growth by spacers 140 to reduce stress and any accompanying defects. At the same time fully walled active regions are produced.

Figure 11:
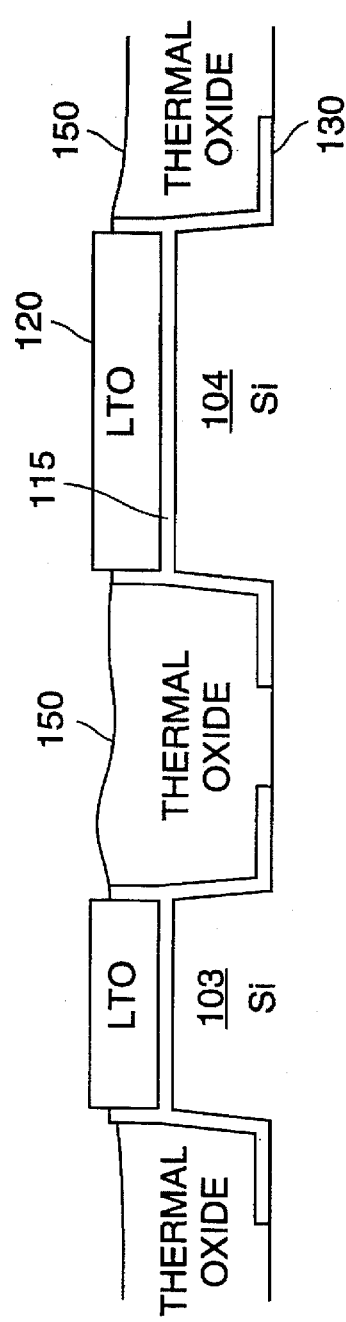

The exposed silicon is then thermally oxidized forming layer 150. The oxidation is continued until a relatively flat surface on layer 150 is obtained, as shown in FIG. 11.

Figure 12:
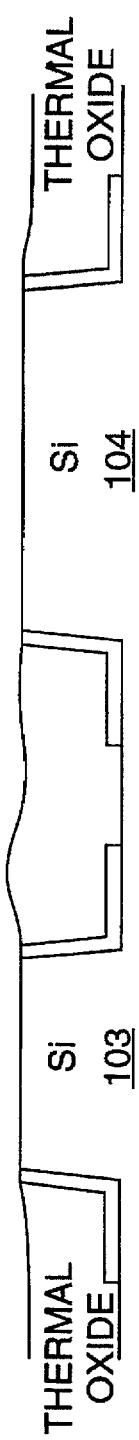

Next, the LTO layer 120 is etched from the active regions 103 and 104 of the substrate. Finally, the nitride/oxide layer 115 is also etched. The result is shown in FIG. 12.

It should be noted that the methods described above are aimed at insuring that the mesa areas (plane and sidewalls) are covered with oxide. This is to enhance the SEG/ELO selectivity. Since selectivity to nitride is possible, the above processes could be simplified by eliminating some of the LTO deposition steps described above.

While the present invention has been disclosed with particular reference to the preferred embodiments, those embodiments are presented by way of example, not by way of limitation. Those of ordinary skill in the art would be enabled by this disclosure to add to or to modify these embodiments in various ways as needed and still be within the scope and spirit of the present invention as recited in the appended claims.

What is claimed is:

1. A method of defining isolated device active regions in a silicon substrate, the method comprising:

forming an active region mask on a surface of the substrate such that the active region mask covers preliminary device active regions of the substrate and exposes preliminary field oxide isolation regions of the substrate;

etching the exposed preliminary field oxide isolation regions to form trenches having a bottom surface formed at a depth in the silicon substrate below the surface of the silicon substrate, thereby forming silicon mesas in the preliminary device active regions of the substrate;

removing the active region mask from the substrate;

forming a first layer of dielectric material on the substrate;

forming a second layer of dielectric material on the first layer of dielectric material;

forming a second mask on the second layer of dielectric material such that the second mask covers the silicon mesas and extends over portions of the bottom surface of the trenches directly adjacent to the silicon mesas, thereby exposing a surface of the second dielectric material formed centrally over the bottom surface of the trenches;

removing portions of the second layer of dielectric material and of the first layer of dielectric material not covered by the second mask, thereby exposing the central portions of the bottom surface of the trenches and defining dielectric steps at peripheral portions of the bottom surface of the trenches directly adjacent sidewalls of the silicon mesas;

performing a selective epitaxial growth (SEG) step in combination with an epitaxial lateral overgrowth (ELO) step such that SEG/ELO silicon is deposited on the exposed central portions of the bottom surface of the trenches while etching of silicon thus grown occurs on surfaces of the second layer of dielectric material;

oxidizing the SEG/ELO silicon to form field oxide isolation regions in the trenches; and removing the second layer of dielectric material and the first layer of dielectric material from the surface of the silicon mesas to define isolated device active regions.

2. The method according to claim 1 and wherein the first layer of dielectric material is deposited oxide.

3. The method according to claim 2, wherein the LTO oxide is between 1 and 2 micrometers thick.

4. The method according to claim 1, wherein the first layer of dielectric material comprises a layer of nitride and an underlying layer of pad oxide.

5. The method according to claim 4, wherein the pad oxide layer is between 200 Å and 400 Å thick and the nitride layer is between 500 Å to 1000 Å thick.

6. A method of defining isolated device active regions in a silicon substrate, the method comprising:

forming a first layer of dielectric material on a surface of the substrate;

forming a second layer of dielectric material on the first layer of dielectric material;

forming an active region mask on the second layer of dielectric material such that the active region mask covers preliminary device active regions of the substrate and does not cover preliminary field oxide isolation regions of the substrate;

removing portions of the second layer of dielectric material and the first layer of dielectric material thereby exposing surface portions of the preliminary field oxide isolation regions;

etching the exposed surface portions of the preliminary field oxide isolation regions to form trenches having a bottom surface formed at a depth in the substrate below the surface of the substrate, thereby forming silicon mesas in the preliminary device active regions;

forming a third layer of dielectric material over the structure resulting from the previous steps;

forming a fourth layer of dielectric material on the third layer of dielectric material;

etching the fourth layer of dielectric material to form dielectric material spacers in the trenches in direct proximity to sidewalls of the silicon mesas, thereby defining central portions of the bottom surfaces of the trenches between the dielectric material spacers;

removing portions of the third layer of dielectric material between the dielectric material spacers to thereby expose the central portions of the bottom surface of the trenches;

performing a selective epitaxial growth (SEG) step in combination with an epitaxial lateral overgrowth (ELO) step such that SEG/ELO silicon is deposited on the exposed central portions of the bottom surfaces of the trenches;

oxidizing the SEG/ELO silicon to form field oxide isolation regions in the trenches; and removing the fourth layer of dielectric material and the third layer of dielectric material from the surface of the silicon mesas to define the isolated device active regions.

7. The method according to claim 6, wherein the second and fourth layer of dielectric material are deposited oxide.

8. The method according to claim 6, wherein the first layer of dielectric material comprises a first nitride layer and an underlying first oxide layer, and wherein the third layer of dielectric material comprises a second nitride layer and an underlying second oxide layer.

9. The method according to claim 8, wherein the first oxide layer is between 200 Å and 400 Å thick and the first nitride layer is between 500 Å to 1000 Å thick.

* * * * *